(12) United States Patent
Ren

(10) Patent No.: US 6,195,619 B1
(45) Date of Patent: Feb. 27, 2001

(54) SYSTEM FOR ALIGNING RECTANGULAR WAFERS

(75) Inventor: Jie Ren, Bedford, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 09/363,159

(22) Filed: Jul. 28, 1999

(51) Int. Cl.$^7$ ................................................. G01R 31/265
(52) U.S. Cl. ..................... 702/155; 702/150; 700/213; 700/218; 414/744.5; 414/936
(58) Field of Search ..................................... 702/150, 151, 702/152; 700/218, 213, 215, 714; 414/744.5, 935, 936; 318/568.11, 568.15; 324/719

(56) References Cited

U.S. PATENT DOCUMENTS

| | | | |
|---|---|---|---|
| 4,457,664 | 7/1984 | Judell et al. | 414/779 |
| 4,897,015 | 1/1990 | Abbe et al. | 414/744.8 |
| 5,102,280 | 4/1992 | Poduje et al. | 414/744.5 |
| 5,332,352 | 7/1994 | Poduje et al. | 414/744.6 |

Primary Examiner—Kamini Shah
(74) Attorney, Agent, or Firm—Perman & Green, LLP

(57) ABSTRACT

A system is provided for determining an eccentricity vector $\epsilon$ which defines the magnitude and direction of an initial placement displaced from a desired location of a centroid O of a right quadrilateral semiconductor wafer which may be clear or opaque. With an initial point of reference desirably established on its peripheral edge for detection by an edge sensor, the wafer is rotated about a point P and a curve defining the profile of the peripheral edge is obtained. The eccentricity vector is computed from the sensed positions of the corners of the wafer and has a magnitude representative of the spatial dislocation of the centroid O relative to the point P and having an orientation $\phi$ representative of the angle subtended by a first line connecting the point P and the centroid O relative to a second line connecting opposite corners of the wafer. As processing proceeds, the wafer is inserted into an aligner station, then repositioned from an initial position to a desired position, then advanced seriatim into a plurality of processing stations while maintaining the desired position previously attained. The aligner and the processing stations may be evacuated. The wafer may be post positioned to a new desired position by rotating the wafer until a side thereof is generally parallel to an internal wall of the aligner station, enabling an end effector of a robot arm to readily lift the wafer from its support and advance it into the processing stations while maintaining the desired position previously attained.

15 Claims, 8 Drawing Sheets

SYSTEM FOR ALIGNING RECTANGULAR WAFERS

BACKGROUND OF THE INVENTION

1. Field of the Invention

The present invention relates to the field of materials processing, and more particularly, to the alignment of substrates such as semiconductor wafers on robot arms and in processing stations and, still more particularly, to the alignment of substrates, or wafers, of non-standard shape, for example, rectangular or, more broadly, right quadrilateral shaped wafers.

2. Description of the Prior Art

The production and quality control processes used by semiconductor device manufacturers and material producers often require a precise knowledge of such wafer characteristics, as wafer center and orientation, among others. Automated, high throughput assembly line like wafer checking systems are employed to obtain the desired information. The wafers must be aligned about their centers, and their flats selectively oriented in space, before being fed to the selected wafer characterization stations of a particular wafer checking system. In this regard, U.S. Pat. No. 4,457,664 to Judell et al. discloses a wafer alignment station that automatically aligns a wafer, having flats, about its centroid and orients the flats selectively in space which is suitable for use in automated production and quality control. The wafer alignment station suitably may be packaged in a module which is compatible for use with other wafer characterization stations in a high throughput material processing system.

For a number of years now, robot arms have been increasingly utilized for moving objects from one location to another. In the application of robotics to semiconductor wafer processing, a robot arm is useful for conveying a semiconductor wafer from one location to another through the use of independently controllable radial, circumferential and elevational motions. For many purposes, however, it is important that the wafer transported by the robot arm must be placed in a predetermined alignment with respect to its centroid and fiducial, if present.

According to the teaching of the inventions disclosed in U.S. Pat. Nos. 5,332,352 and 5,102,280 to Poduje et al., a robot arm is operative with an alignment station to adjust the orientation of a circular wafer or other element on the robot arm to a predetermined alignment for use by the robot arm in placing the wafer at a neighboring station in a desired orientation. According to the Poduje et al. disclosures, the robot arm includes a manipulator having independently controlled and isolated radial, circumferential and elevational motions, specifically, r, $\Theta$, z. A rotating support is provided within the range of placement for a semiconductor wafer carried by the robot arm and has associated with it an edge detector which determines the location of a wafer edge as it is rotated on the rotary support. The robot arm executes r, $\Theta$, z independent commands to cradle a wafer on its end effector or hand from a first location. The robot arm then places the wafer upon the rotary support where it is spun with the edge over the edge detector. The edge location is detected by electronics which determines the amount of motion of the centroid to produce alignment of the wafer on the rotary support and/or to locate the wafer fiducial in a predetermined location. The robot arm is then manipulated in a first case to move the wafer on the rotary support until alignment is secured with the fiducial relocated to a predetermined position. The wafer is again picked up by the robot arm for delivery to a further station in predetermined alignment. In a second case the robot arm is operative to pick up the wafer with the known misalignment and correct for such misalignment in delivering the wafer to a subsequent station.

It was with knowledge of the foregoing state of the technology that the present invention has been conceived and is now reduced to practice.

SUMMARY OF THE INVENTION

There has been an increasing demand for aligning non-SEMI (Semiconductor Equipment and Materials International) standard wafers, such as right quadrilateral wafers for MR (Magnetic Readhead) processing. Current aligner technology cannot handle these wafers. A new design has therefore been conceived and implemented which uses only a single sensor. Further, the alignment algorithm employed is sufficiently robust as to automatically compensate for any sensor assembly tolerance. It can align a wide range of sizes of rectangular, including square, wafers. According to the invention, the wafer is rotated 360 degrees and the edge data points are collected using a suitable sensor. The data is then processed to find the corners and the fiducial, if any.

More fully, a system is provided by the invention for determining an eccentricity vector $\epsilon$ which defines the magnitude and direction of an initial placement displaced from a desired location of a centroid O of a right quadrilateral semiconductor wafer which may be clear or opaque. With an initial point of reference desirably established on its peripheral edge for detection by a sensor, the wafer is rotated about a point P and a curve defining the profile of the peripheral edge is obtained. Viewing FIG. 9, the eccentricity vector is computed from the sensed positions of the corners of the wafer and has a magnitude representative of the spatial dislocation of the centroid O relative to the point P and having an orientation $\phi$ representative of the angle subtended by a first line connecting the point P and the centroid O relative to a second line connecting opposite corners of the wafer. As processing proceeds, the wafer is inserted into an aligner station, then repositioned from an initial position to a desired position, then advanced seriatim into a plurality of processing stations while maintaining the desired position previously attained. The aligner and the processing stations may be evacuated. The wafer may be post positioned to a new desired position by rotating the wafer until a side thereof is generally parallel to an internal wall of the aligner station, enabling an end effector of a robot arm to readily lift the wafer from its support and advance it into the processing stations while maintaining the desired position previously attained.

A primary feature, then, of the present invention is the provision of a system for aligning wafers such as semiconductor wafers being transported on robot arms to and from one or more processing stations.

Another feature of the present invention is the provision of such a system for transporting non-standard wafers, for example quadrilateral shaped wafers.

Still another feature of the present invention is the provision of such a system according to which the wafer has an initial point of reference formed on its peripheral edge and is rotated about a point P and the profile of its peripheral edge is sensed and a curve defining the profile of the peripheral edge is generated based on measurements obtained by the sensor relative to the initial point of reference and an eccentricity vector computed from the sensed positions of the corners of the wafer.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and together with the description, serve to explain the principles of the invention in general terms. Like numerals refer to like parts throughout the disclosure.

DETAILED DESCRIPTION OF THE PREFERRED EMBODIMENT

Refer now to the drawings. The present invention contemplates an alignment aid for a robot arm which permits the alignment of an element such as a semiconductor wafer, being manipulated and transported by the robot arm, to be adjusted for delivery to a predetermined location with a predetermined alignment.

Figure 1:
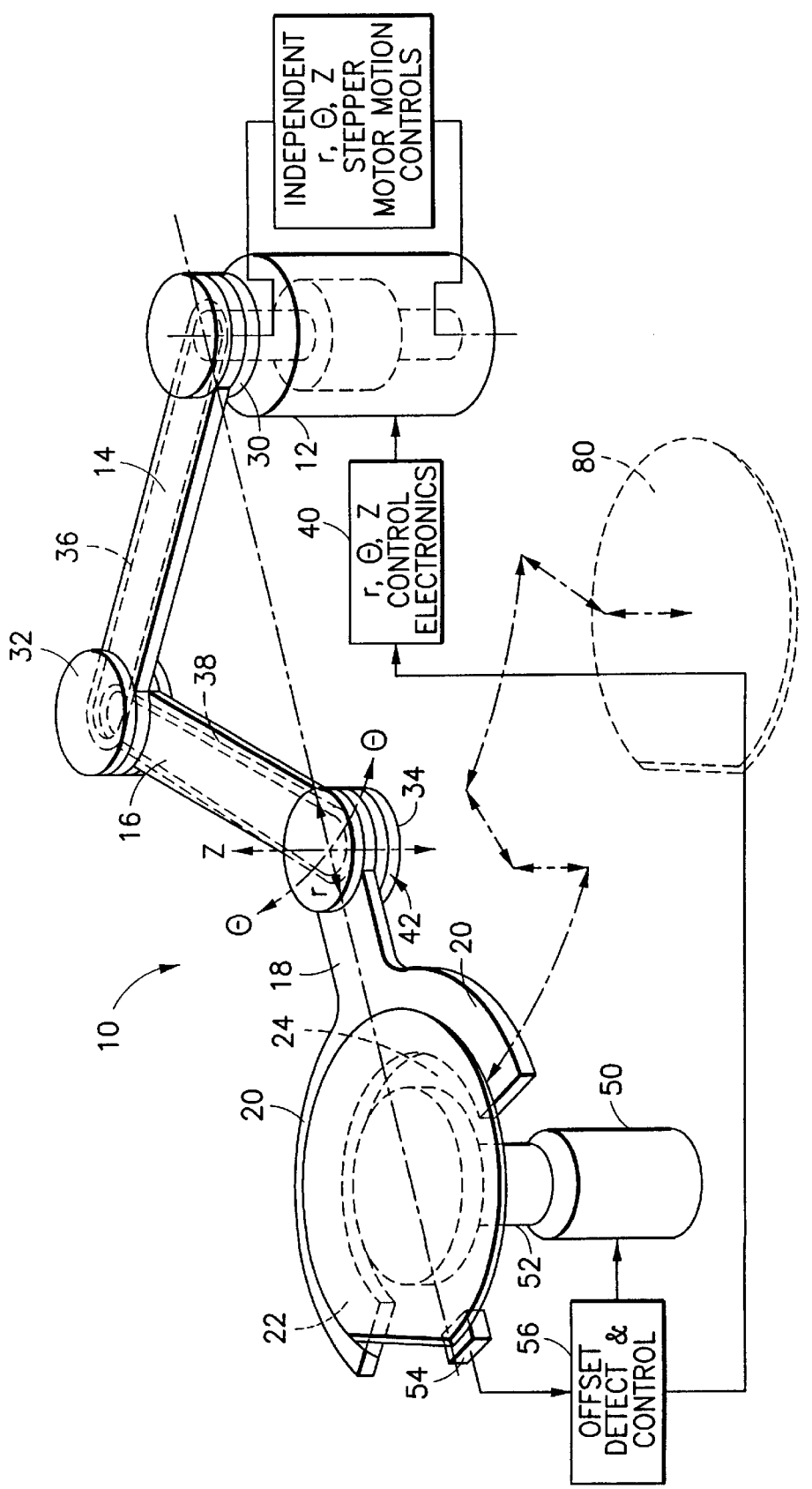
FIG. 1 is a perspective view of a known robot arm and wafer alignment aid.

In commonly assigned U.S. Pat. No. 5,102,280 to Poduje et al. issued Apr. 7, 1992 and specifically incorporated herein in its entirety by reference, there is illustrated a robot arm 10 of the type shown in FIG. 1. As illustrated, the robot arm 10 comprises a base support 12 outward from which is a cantilevered multi-leg robot arm having first and second arms 14 and 16 and a terminal end effector 18. The end effector 18 in the embodiment for use in semiconductor wafer handling includes a "Y" shaped termination having fingers 20 adapted to cradle a semiconductor wafer 22 while leaving a center portion 24 uncovered for placing of the wafer upon diverse instruments.

The leg 14 is joined to the base member 12 through a pivot housing 30. The legs 14 and 16 are pivotally joined through a pivot housing 32. The leg 16 and the end effector 18 are joined through a pivot housing 34. A pulley within the housing 32, and fixed to the leg 16, has a diameter of one normalized unit. A belt 36 is wrapped around that pulley and extends to a pulley of two normalized units diameter within the housing 30. A pulley of one normalized unit diameter within the housing 32 is affixed to the leg 14 and has wrapped about it a belt 38 which is wrapped about a pulley of two normalized units diameter which is in turn affixed to the end effector 18.

The base member 12 contains three motion systems, independently controllable by r, Θ, z control electronics 40. Electronics 40 control individual motional systems within the base member 12 which produce independent r, Θ, z motion along the axis generally located at 42. It will be appreciated that the r direction of motion is strictly linear along a line passing through the center of the wafer 22 and the center or rotational axis of the housings 34 and 30. Such r motion is accomplished by rotating the leg 14 about the axis of the housing 30 while maintaining the pulley of two normalized units diameter fixed within the housing 30. Θ motion is accomplished by rotating the entire housing 30 and leg 14 as a unit, while z motion is accomplished by elevating the housing 30 and arm 14 as a unit, or alternatively by elevating the base 12 above a support.

The ratio of pulley couplings and their arrangement produces a strictly r or radial motion of the end effector 18 independent of motion in either Θ or z. Also both Θ and z motions are produced by the motor systems within the base 12 as independent motions with respect to the other two axis.

A pedestal 50 rotationally supports a vacuum chuck 52 on which the wafer 22 may be supported with the vacuum chuck supported to hold the wafer in the region 24 between the fingers 20 of the end effector 18. Combined r, Θ, z motion of the robot arm can position the wafer 22 over the vacuum chuck while the arm is then lowered to transfer support for the wafer from the end effector 18 to the vacuum chuck 52.

An edge sensor 54 of capacitive or other design is provided to detect the position of the edge of the semiconductor wafer 22 as it is rotated on the vacuum chuck 52. That positional information is provided to an offset detect and control circuit 56 which, in accordance with the teaching of the above-identified U.S. Pat. No. 4,457,664, determines the amount and angle of misalignment of the wafer 22 upon the vacuum chuck 52 and correspondingly of the degree to which the wafer was misaligned upon the end effector 18 when originally transferred from the end effector to the vacuum chuck 52.

Figure 2:
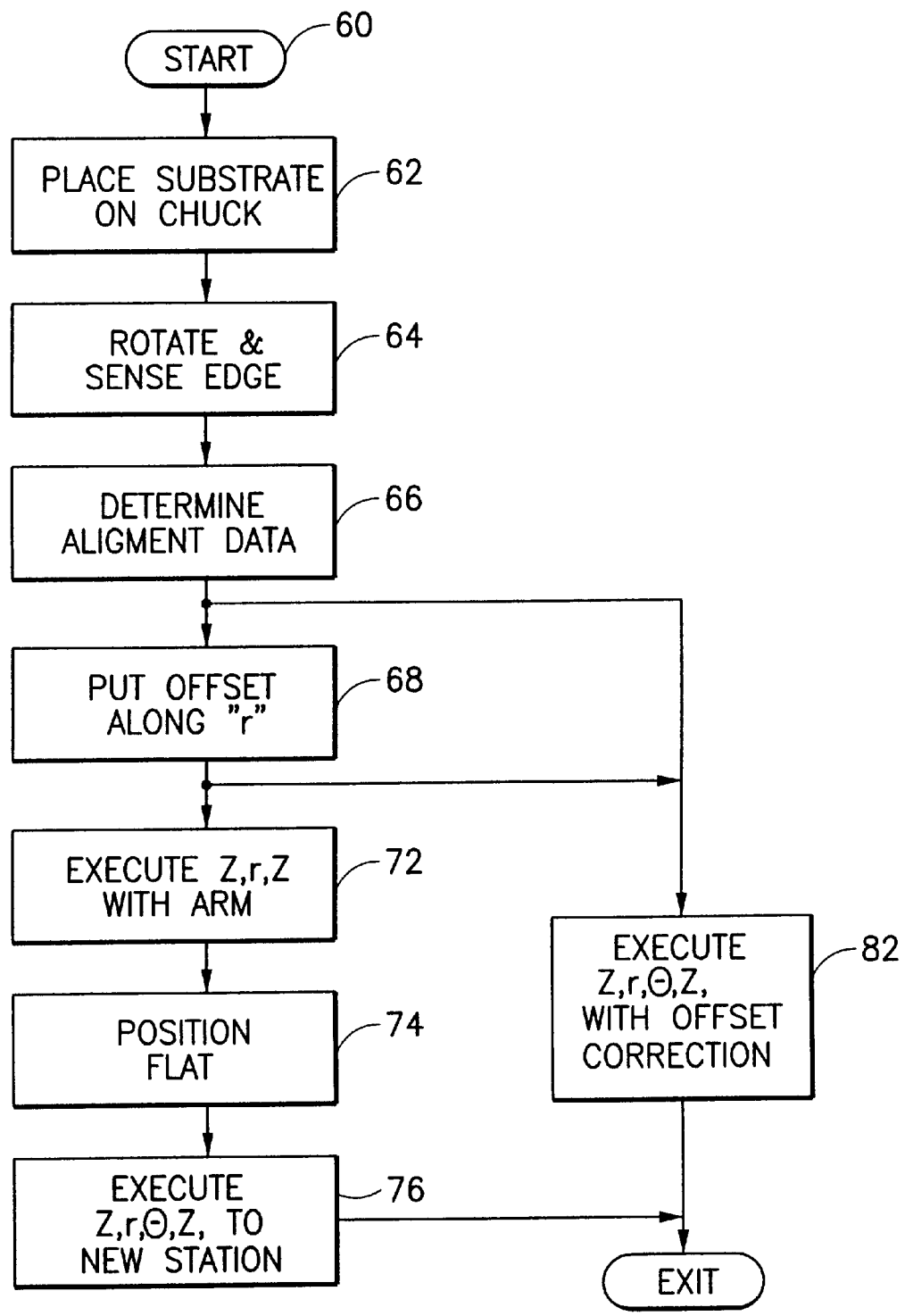
FIG. 2 is a flow chart depicting the operation of the robot arm of FIG. 1.

In one instance, this information is utilized in accordance with the processing of FIG. 2 to align the wafer 22 upon the vacuum chuck 52 and to return it to the end effector 18 in a predetermined alignment condition. In particular, and as illustrated in FIG. 2, from a start state 60, the robot arm 10 is controlled by the motion systems within the base 12 to place the wafer on the vacuum chuck 52 in a step 62. In a subsequent step 64, the vacuum chuck 52 is rotated by the motor support 50. The position of the edge is detected by the sensor 54 and processed by electronics 56 to identify the position of the wafer centroid relative to the center of rotation of the vacuum chuck 52 in step 66. In subsequent step 68, the vacuum chuck 52 positions the wafer so that the offset lies along an axis 70 which is the axis through the center of the vacuum chuck 52 and the center of the housing 30. The robot arm is then activated in step 72 and the wafer picked up by the end effector 18 and moved along the axis 70, strictly in linear motion along the r direction, to reposition the wafer upon the vacuum chuck 52 so that its centroid is positioned upon the axis of rotation. Steps 64 through 68 may be repeated one or more times for verification or for error minimization purposes.

Thereafter in step 74 the position of an artifact such as the fiducial or flat on the wafer 22 is placed in a predetermined location and in a subsequent step 76 the robot arm is activated and the wafer transferred to the end effector 18 with a now predetermined known alignment. With a predetermined number of independently controlled and quantified steps in the r, Θ, z directions produced by the motional systems within the base member 12, the wafer 22 may be repositioned at a predetermined subsequent station, such as station 80, with a predetermined alignment.

Alternatively, in a second case, the operation may branch after steps 66 or 68 to a step 82 in which the wafer 22 is transferred to the end effector 18 prior to realignment on the vacuum chuck 52, but with a known degree of misalignment. The wafer 22 is then transferred by the robot arm under the control of the motion systems in the base member 12 to move the wafer 22 a prescribed number of steps in independent r, Θ, z direction, with a misalignment offset calculated into the motional steps, to position the wafer at the station 80 in the same predetermined alignment.

Figure 3:
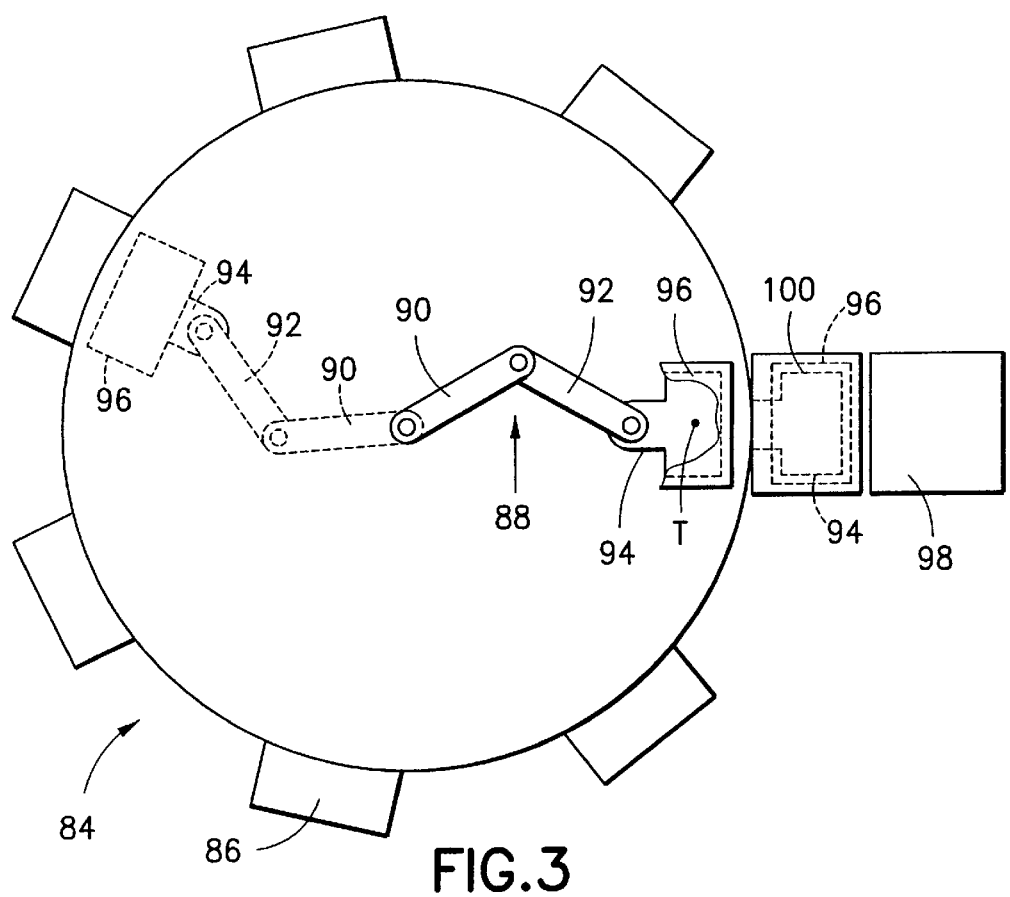
FIG. 3 is a diagrammatic plan view which illustrates a cluster tool including a plurality of processing stations around its periphery.
Figure 4:
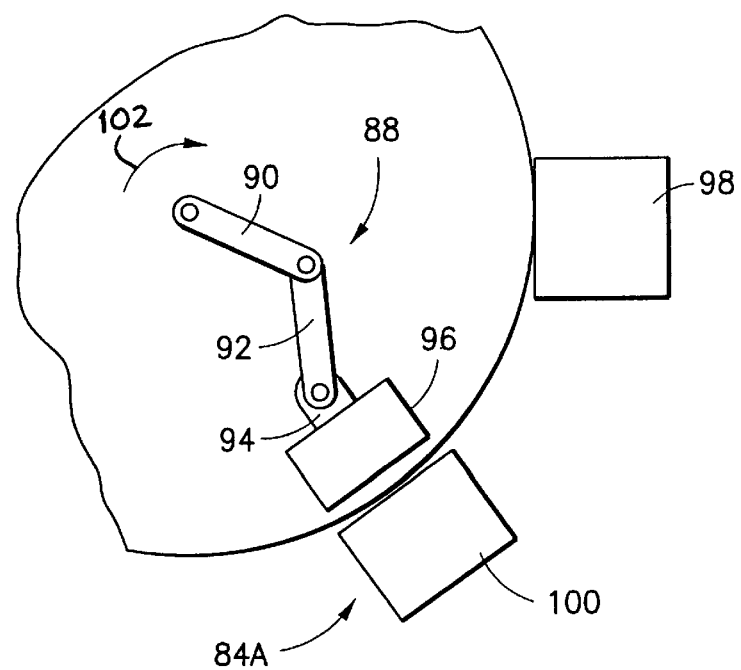
FIG. 4 is a detail diagrammatic plan view of a portion of a cluster tool, similar to that illustrated in FIG. 3, but depicting another embodiment thereof.

For a description of the present invention, turn now initially to FIG. 3 which diagrammatically illustrates a cluster tool 84 including a plurality of processing stations 86 around its periphery. A robot arm 88, generally having the construction of the robot arm 10, is centrally located within the cluster tool and, utilizing an upper arm 90, a fore arm 92, and an end effector 94, is capable of transporting a semiconductor wafer or wafers 96 from a load lock 98 through an aligner 100, then into the processing stations 86, one at a time. In the aligner 100, the wafer becomes properly positioned according to the invention in a manner to be described for subsequent transfer to the processing stations. In an alternative construction illustrated in FIG. 4, aligner 100 is peripherally spaced from the load lock 98 rather than being aligned with it. In this instance, the end effector 94 of the robot arm 88 receives the wafer 96 to be processed through the load lock 98 but before delivering the wafer to one or more of the processing stations 86. In either instance, the aligner 100 may be either evacuated or of a non-vacuum or atmospheric type. After receiving the wafer in the load lock, the robot arm pivots or sweeps clockwise as indicated by arrow 102 and delivers the wafer first to the aligner 100 to be properly positioned, then to the appropriate processing stations 86 as previously described.

Figure 5:
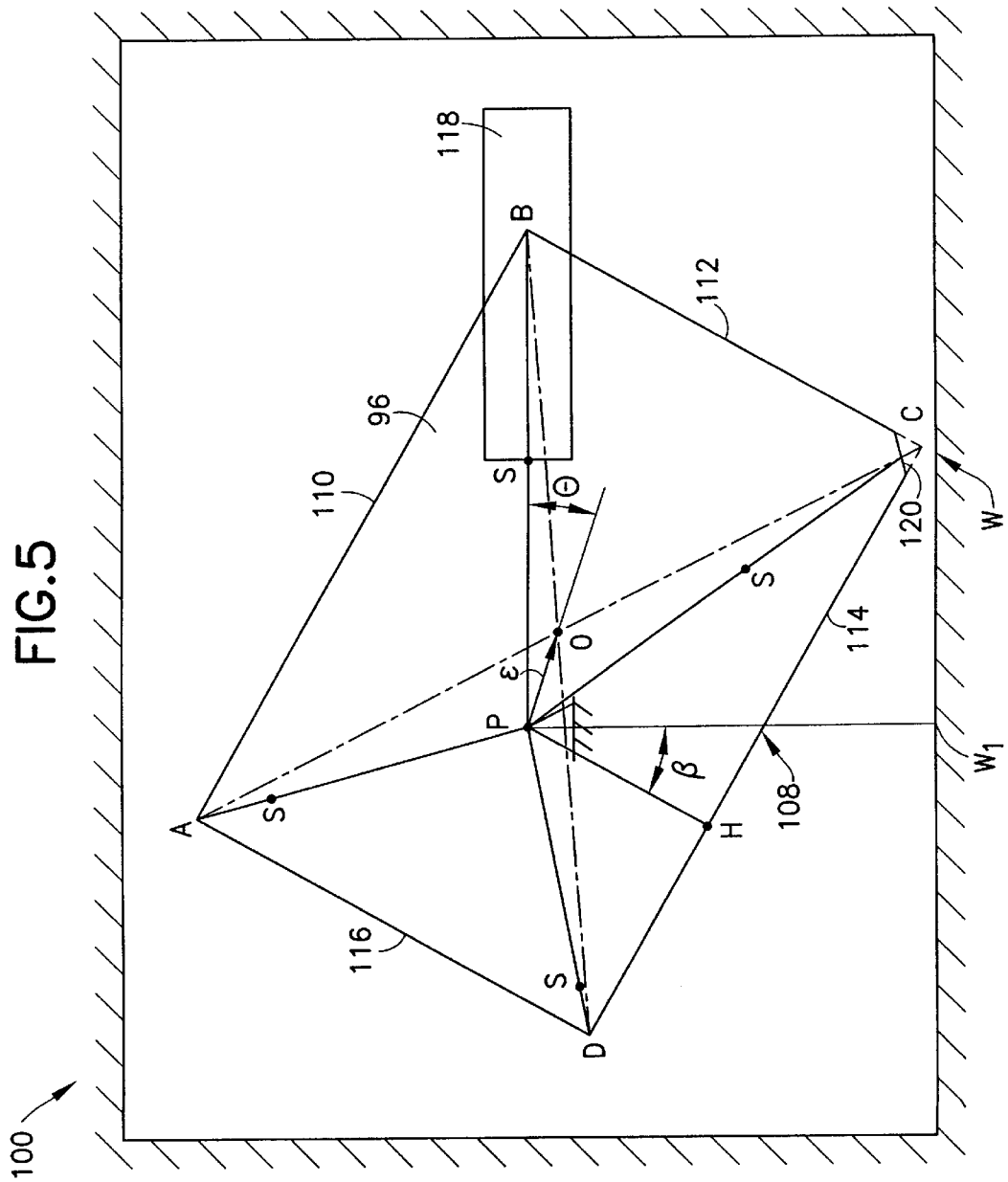
FIG. 5 is a diagrammatic plan view illustrating a wafer positioned within an aligner associated with a cluster tool.

For the processing which occurs within the cluster tool or other system component, it is important that the wafer be consistently positioned in each of the processing stations 86. To do this, viewing FIGS. 5 and 6, it is critical that the centroid O of the wafer 96 be aligned with an axis of rotation 104 of a supporting chuck 106 so that rotation of the chuck will be similarly imparted proportionally to all locations on the wafer. The invention, then, is concerned with a technique for determining an eccentricity vector C (FIG. 5) which defines the magnitude and direction of the displacement from a desired location of the wafer 96 having the form of a right quadrilateral. As noted above, the wafer has a centroid O and four peripherally spaced corners A, 13, C, and D, respectively, a continuous peripheral edge 108, and four sides, namely, 110 (or $\overline{AB}$), 112 (or $\overline{BC}$), 114 ($\overline{CD}$), and 116 (or $\overline{DA}$). According to the technique of the invention, the wafer 96 is supported for rotation about the axis of rotation which intersects the wafer at a point P. A suitable edge sensor 118, which may be, for example, a CCD linear array, is provided for detecting the profile of the peripheral edge 108 as the wafer is rotated about the axis of rotation 104. The point S in FIG. 5 represents a point on the extreme edge of the sensor 118 and coextensive with the wafer 96, regardless of its particular orientation about the point P. For purposes of explanation, the point S is depicted on each of the lines $\overline{PA}$, $\overline{RB}$, $\overline{PC}$, and $\overline{PD}$ to indicate a point common to each such line when it overlies the sensor.

An initial point of reference, such as; a fiducial 120 may be established on the peripheral edge for detection by the edge sensor. The fiducial 120 may be, for example, a beveled edge at corner C (FIG. 5). The purpose of the fiducial is to enable either an operator manually handling the wafer or the machine in the course of its automatic operation to be able to be generally aware of the orientation of the wafer. It will be appreciated that the fiducial, in an extreme instance, may even be an entire side of the wafer.

Figure 6:
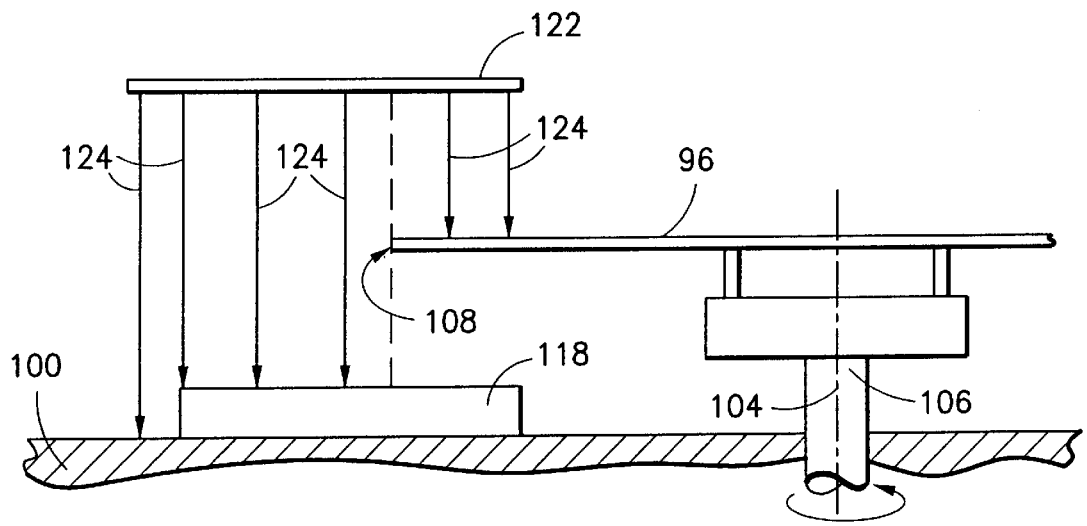
FIG. 6 is a diagrammatic side elevation view of the wafer mounted on a supporting chuck for a operation performed by an edge sensor.

At some point in the operation of the cluster tool 84, the wafer 96 is placed on the supporting chuck 106 within the aligner 100 after its arrival from the load lock 98. As earlier noted, when this occurs, the centroid O of the wafer is offset relative to the point P at which the axis of rotation 104 intersects the wafer and the goal of the invention is to align the point P with the centroid O, either with the aligner or with the robot arm. As seen in FIG. 6, a suitable light source 122 which may be, for example, an LED (light emitting diode), is positioned within the aligner 100 so as to direct a broad beam of light as represented by multiple arrows 124 toward the edge or light sensor 118 in a direction transverse of a plane of the wafer 96 and coextensive with the peripheral edge 108 of the wafer. In this manner, only light not obstructed by the wafer reaches, and is detected by, the edge sensor 118. The supporting chuck 106 is then rotated for no less than a single revolution at a moderate rate of speed and the edge sensor 118 senses the profile of the peripheral edge 108. From that information, the control circuit 56 generates a curve 126 (FIG. 7) defining the profile of the peripheral edge including the four sides 110 (or $\overline{AB}$), 112 (or $\overline{BC}$), 114 ($\overline{CD}$), and 116 (or $\overline{DA}$) and the four peripherally spaced corners A, B, C, and D based on measurements obtained by the edge sensor relative to the initial point of reference.

Figure 6A:
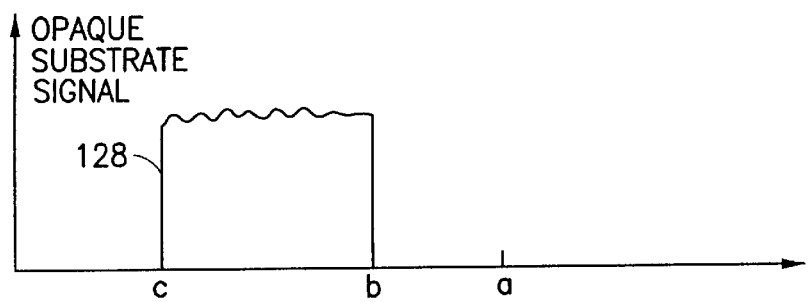
FIG. 6A is a graph associated with FIG. 6 presenting the signal obtained by an edge sensor directed at an opaque wafer.

As seen in FIG. 6, if the wafer 96 is opaque, the edge sensor 118 only receives that light from the light source 122 which is outboard, or to the left, of the peripheral edge 108 and thereby generates a signal 128 as depicted in FIG. 6A between the values of "b" and "c" presented along the abscissa. Of course, still viewing FIG. 6A, inboard, or to the right, of the peripheral edge 108, between the values of "b" and "a" presented along the abscissa, the signal is zero.

Figure 6B:
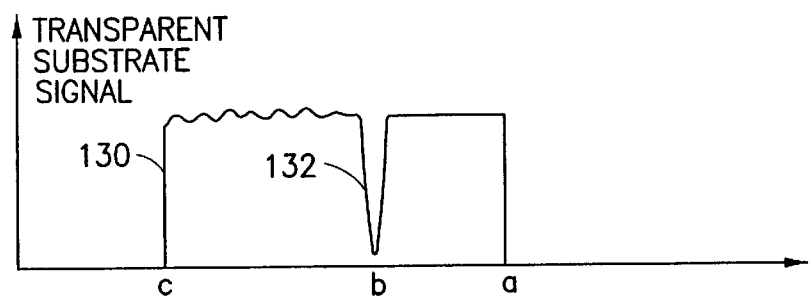
FIG. 6B is a graph associated with FIG. 6 presenting the signal obtained by an edge sensor directed at a transparent wafer.

In the alternative, but still viewing FIG. 6, if the wafer 96 is transparent, some other approach must be taken in order to generate the curve 126. In this instance, some continuous artifact such as a light-altering groove which would not subsequently affect the operation of the wafer 96 but would alter the light transmissibility of the transparent wafer and enable some kind of recognition by the edge sensor 118 is formed on the peripheral edge 108. The edge sensor 118 receives light from the light source 122 across its entire range of competence and thereby generates a signal 130 as depicted in FIG. 6B between the values of "a" and "c" presented along the abscissa. However, still viewing FIG. 6B, at the value of "b", the signal 130 is modified by a signal notch 132 which is an optical effect resulting from the artifact provided on the peripheral edge 108 of the transparent wafer 96. It is this signal notch 132 which determines the actual position of the wafer edge at any rotational position Θ.

Figure 7:
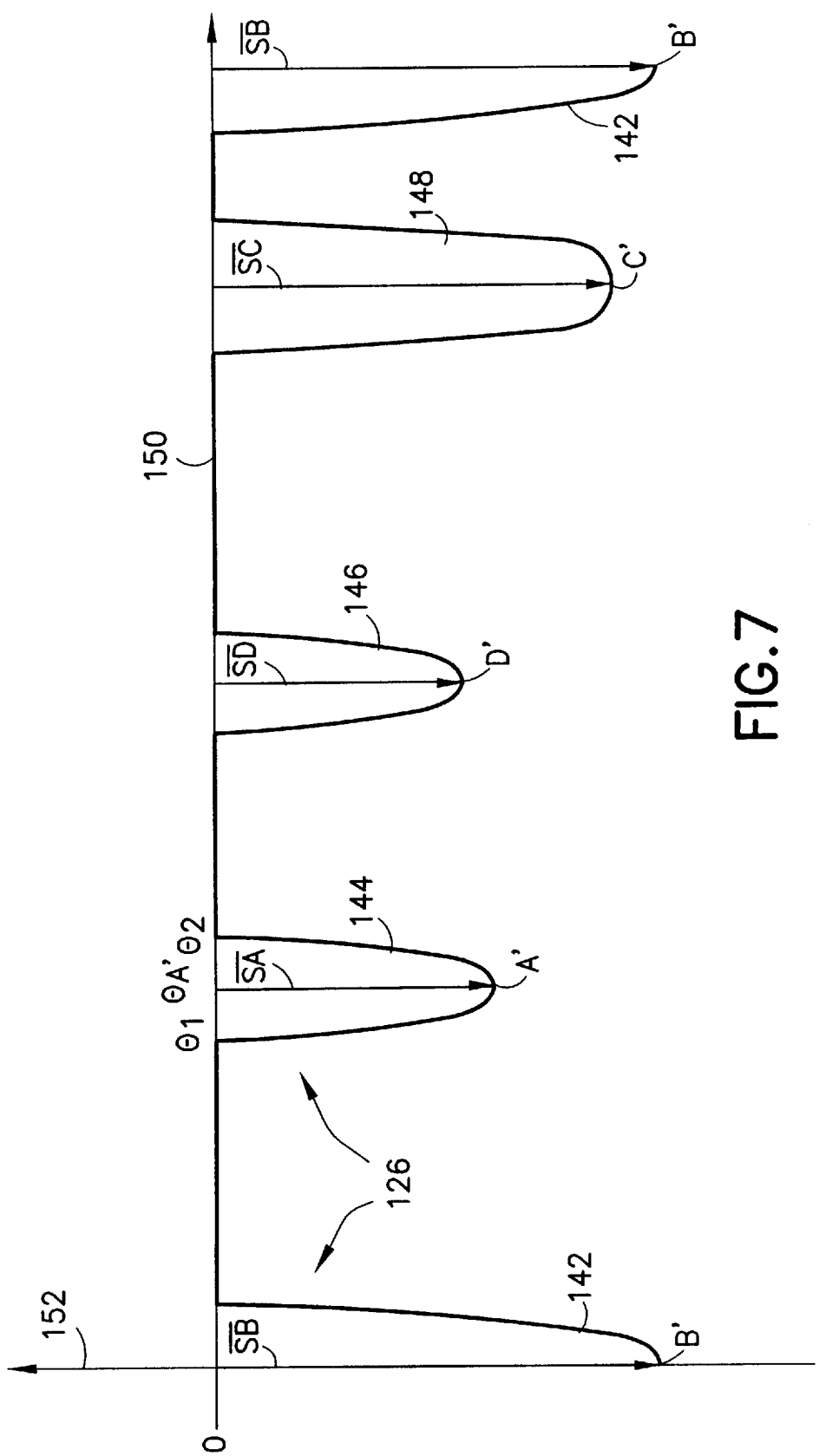
FIG. 7 is a curve defining the profile of the peripheral edge of the wafer based on measurements obtained by the edge sensor illustrated in FIG. 6.

In either event, as seen in FIG. 7, the curve 126 is generated on an XY coordinate system which includes four discrete generally parabolic sections 142, 144, 146, 148 extending transverse of the abscissa or X-axis 150 measuring the angular rotation, Θ, of the wafer 96 between 0° and 360°. The four discrete generally parabolic sections 142, 144, 146, 148 are spaced apart and generally mutually parallel and each parabolic section has a nose at a location of maximum perpendicular distance from the linear aligned sections. Thus, in FIG. 7, a nose B' is located on the parabolic section 142 the perpendicular distance $\overline{SB}$ from the abscissa 150. As illustrated, the distance $\overline{SB}$ is aligned with the ordinate or Y-axis 152 at 0° of rotation. In similar fashion, a nose A' is located on the parabolic section 144 the perpendicular distance $\overline{SA}$ from the abscissa 150; a nose D' is located on the parabolic section 146 the perpendicular distance $\overline{SD}$ from the abscissa 150; and a nose C' is located on the parabolic section 148 the perpendicular distance $\overline{SC}$ from the abscissa 150. The distances $\overline{SA}$, $\overline{SB}$, $\overline{SC}$, and $\overline{SD}$ all reflect the measurements obtained by the edge sensor 118 as described above.

Figure 8:
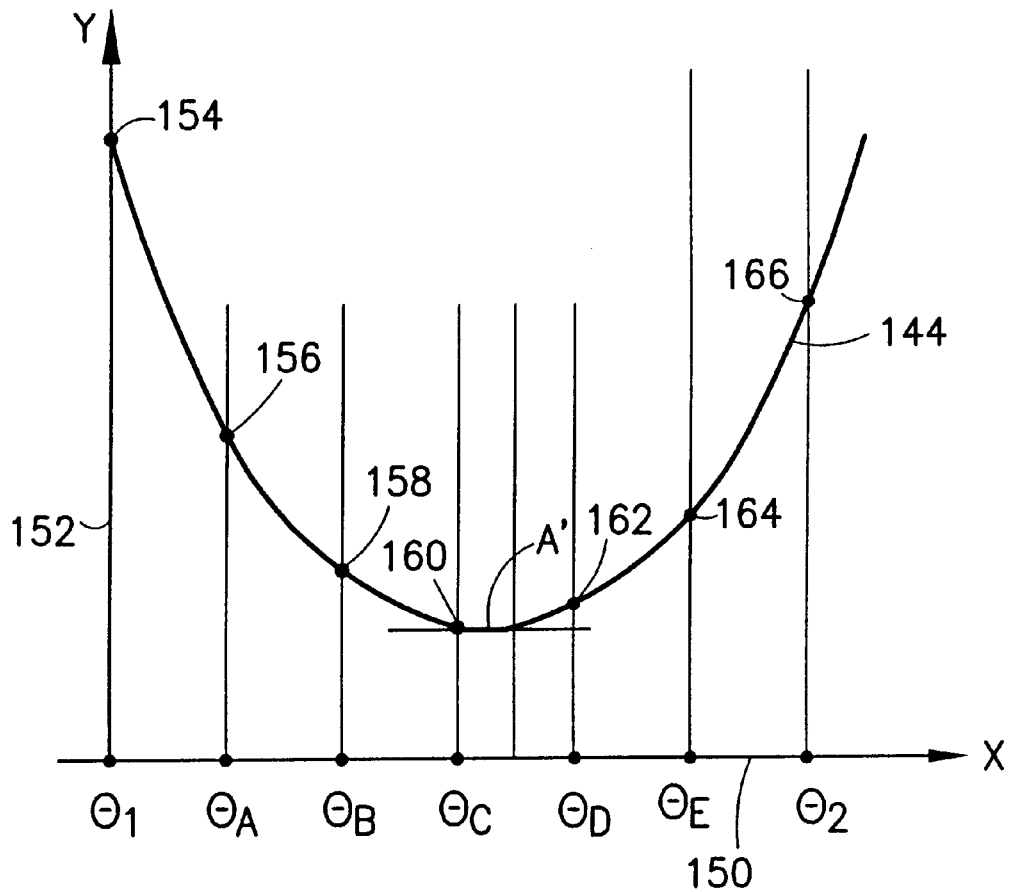
FIG. 8 illustrates an enlarged portion of the curve of FIG. 7.

In order to locate each corner in the XY coordinate system, for each parabolic section 142, 144, 146, 148, the objective is to determine $y_{min}$ and thereby locate A', B', C' and D'. With continuing reference to FIG. 7 and turning now also to FIG. 8, this technique will now be described. As seen in FIG. 7, and as previously discussed, the curve 126 defining the peripheral edge of the wafer 96 is first positioned in the XY coordinate system. Then, in the region of the nose for each of the four discrete parabolic sections 142, 144, 146, 148, the rate of change of direction of the curve 126 in the direction of the ordinate 152 with increased distance along the abscissa 150 is computed. More specifically, between $\Theta_1$ and $\Theta_2$, for example at discrete points $\Theta_A$, $\Theta_B$, $\Theta_C$, $\Theta_D$, and $\Theta_E$ (FIG. 8), in the region of the nose for each of the four discrete parabolic sections, the rate of change of direction of the curve 126 is computed in the direction of the ordinate with increased distance along the abscissa 150. The location of the curve 126 at which the least rate of change occurs in the direction of the ordinate 152 with increased distance along the abscissa 150 is the location of the corner. This procedure can be performed, as depicted in FIG. 8, by enlarging the curve 126, specifically, the parabolic section 144 in the region surrounding nose A', using curve fitting to fit data points 154, 156, 158, 160, 162, 164, then applying the least square method to interpolate $X_{nose}$ and $y_{nose}$ and arriving at A'.

As earlier mentioned, it is also desirable for the system of the invention to be able to determine the location of the fiducial 120 on the wafer 96. With continuing reference to FIG. 7 and turning now also to FIG. 8, this technique will now be described. As seen in FIG. 7, and as previously discussed, the curve 126 defining the peripheral edge of the wafer 96 is first positioned in the XY coordinate system. Then, in the region of the nose for each of the four discrete parabolic sections 142, 144, 146, 148, between $\Theta_1$ and $\Theta_2$, the objective is to determine the nose which is flattest in the region between $\Theta_1$ and $\Theta_2$. Specifically, the rate of change of direction of the curve 126 in the direction of the ordinate 152 with increased distance along the abscissa 150 is computed. When this is accomplished for each of the four corners, the rates of change are compared and the curve which has the least rate of change is determined to be the corner which has the fiducial. The measurement of $\overline{SC}$ is compensated with the known flat size.

Figure 9:
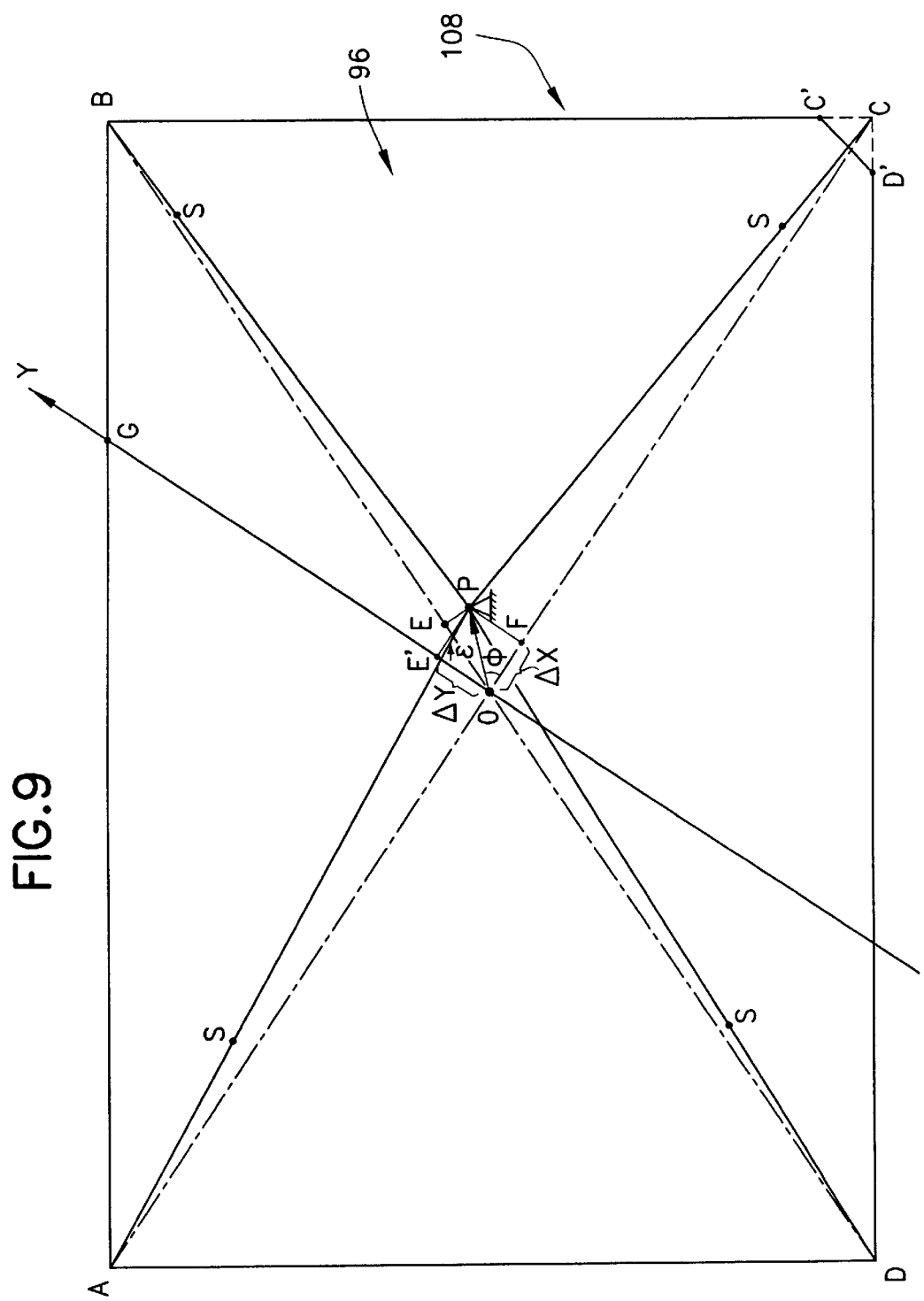
FIG. 9 is a diagrammatic plan view of a wafer as it may be initially positioned on the supporting chuck and illustrating an eccentricity vector ε which defines the magnitude and direction of an initial placement of the wafer displaced from a desired location of the centroid O of the wafer.

Turn now to FIG. 9 which illustrates the wafer 96 in plan view as it may be initially positioned on the supporting chuck 106. It was earlier mentioned that a system is provided by the invention for determining an eccentricity vector ε which defines: the magnitude and direction of an initial placement displaced from a desired location of the centroid O of the right quadrilateral semiconductor wafer 96. It was further explained that with an initial point of reference desirably established on its peripheral edge for detection by a sensor, the wafer is rotated about a point P and a curve defining the profile of the peripheral edge is obtained.

The eccentricity vector is computed by the control circuit 56 from the sensed positions of the corners A, B, C, D of the wafer and has a magnitude representative of the spatial dislocation of the centroid O relative to the point P and having an orientation ϕ representative of the angle subtended by a first line connecting the point P and the centroid O relative to a second line connecting opposite corners of the wafer. For purposes of the following explanation, and as illustrated in FIG. 9, the corners A, B, C, and D of the wafer 96 are positioned successively in a clockwise direction as one advances along the peripheral edge 108 about the centroid O. With this initial arrangement, the X-axis in an XOY coordinate system for purposes of subsequent computations involving the invention is defined as a line $\overline{AC}$ connecting corners A and C and passing through the centroid O. Thereupon, point P, the point on the wafer about which the wafer rotates on the supporting chuck 106, is projected onto the X-axis (line $\overline{AC}$) at a point F to thereby define a line $\overline{OF}$.

The procedure for locating the corners A, B, C, and D and obtaining the measurements of the lines $\overline{SA}$, $\overline{SB}$, $\overline{SC}$, and $\overline{SD}$ has already been explained.

Now, continuing with the technique of the invention, it can be proved that:

$$\overline{SB} - \overline{SD} = \overline{PB} - \overline{PD} \approx \overline{EB} - \overline{ED} = -\overline{OE} \quad (1)$$

$$\overline{SC} - \overline{SA} = \overline{PC} - \overline{PA} \approx \overline{FC} - \overline{FA} = -\overline{OF} \quad (2)$$

Thereupon, a line $\overline{OG}$ is scribed through the centroid O perpendicular to the X-axis to define the Y-axis for ihe XOY coordinate system presently being employed. Thereafter, point P is projected onto the Y-axis at a point E' to thereby define a line $\overline{OE'}$. Based on these operations, the magnitude of ε can be determined as $$\sqrt{\overline{OF}^2 + \overline{OE'}^2}$$

and the orientation ϕ determined as $\tan^{-1}(\overline{OE'}/\overline{OF})$.

By applying Taylor's expansion formula, it can be shown that equations (1) and (2) above are proper and, indeed, that the maximum error obtained is small when using $\overline{PA}$, $\overline{PB}$, $\overline{PC}$, and $\overline{PD}$ rather than $\overline{FA}$, $\overline{FC}$, $\overline{EB}$, and $\overline{ED}$. For example, for a rectangular wafer measuring 3.7 inches by 4.5 inches, the error amounts to less than about 0.0005 inch. This is a most acceptable error.

As earlier explained, the wafer 96 must be properly positioned when placed in each of the processing stations 86. In order to achieve this result, the wafer 96 is placed on the end effector 94, preferably within the aligner 100 in which is also positioned the edge sensor 118. The wafer may be formed with the fiducial 120 as an arbitrary reference or an edge such as the edge 114 may be used as a reference. For purposes of the ensuing description, the edge 114 will be considered to be the reference. In this instance, then, it is desired to reposition the wafer 96 such that the edge 114 is parallel to wall W of the aligner 100. For this purpose, it will be understood that the reference in the form of the edge 114 will be detected by the sensor 118 as the wafer is rotated, as earlier described.

In order to align the edge 114 (that is, line $\overline{DC}$) with the wall W of the aligner 100, it is necessary to move the wafer 96 through an angle b (see FIG. 5) which is an angle subtended by line $\overline{PW_1}$ perpendicular to the wall W of the aligner 100 and a line $\overline{PH}$ which is perpendicular to the edge 114. To obtain the angle b, the distance $\overline{PS}$ between the rotational center of the chuck and an inner edge S of the sensor is first calculated, as follows:

$$\overline{PS} = \left(\epsilon \cos\theta + \sqrt{\epsilon^2 + \cos^2\theta + \overline{OB}^2 - \epsilon^2}\right) \quad (3)$$

The angle b is then calculated by the following equation:

$$\beta = \pi/2 - \tan^{-1}\left[(\overline{PS} + \overline{SB} - x_A)/\sqrt{(\overline{PS} + \overline{SA}) - X_A^2}\right] \quad (4)$$

where $$x_A = \left[(\overline{PS} + \overline{SA})^2 - \overline{AB}\right]/[2(\overline{PS} + \overline{SB})]$$

When the wafer starts at an orientation other than the one illustrated in FIG. 5, an offset angle from the starting orientation to the illustrated orientation is added to the angle b.

When this has been achieved, the end effector is operated to lift the wafer 96 in such a way that the centroid O is aligned with a center T of the end effector 94 (see FIG. 3) and with the edge 114 still parallel to the wall W of the aligner 100. As the robot arm 88 subsequently moves the end effector 94 into each processing station 86,. the position and orientation of the wafer 96 remains in the final position relative to the wall thereof to which it has been moved, as just described.

While preferred embodiments of the invention have been disclosed in detail, it should be understood by those skilled in the art that various other modifications may be made to the illustrated embodiments without departing from the scope of the invention as described in the specification and defined in the appended claims.

What is claimed is:

1. A method of determining an eccentricity vector $\epsilon$ which defines the magnitude and direction of the displacement from a desired location of a right quadrilateral semiconductor wafer having a centroid O and a continuous peripheral edge with four sides and four peripherally spaced corners, the method comprising the steps of:
   (a) supporting the wafer for rotation about an axis of rotation which intersects the wafer at a point P;
   (b) providing an edge sensor for detecting the profile of the peripheral edge;
   (c) establishing an initial point of reference on the peripheral edge for detection by the sensor;
   (d) rotating the wafer about the axis of rotation;
   (e) during step (d), sensing the profile of the peripheral edge and generating a curve defining the profile of the peripheral edge including at least part of the four sides and the four peripherally spaced corners based on measurements obtained by the sensor relative to the initial point of reference; and
   (f) computing an eccentricity vector from the sensed positions of the corners of the wafer, the eccentricity vector $\epsilon$ having a magnitude representative of the spatial dislocation of the centroid O relative to the point P and having an orientation $\phi$ representative of the angle subtended by a first line connecting the point P and the centroid O relative to a second line connecting opposite corners of the wafer.

2. A method as set forth in claim 1 including the steps of:
   (g) inserting the wafer into an aligner station;
   (h) repositioning the wafer from an initial position to a desired position; and
   (i) advancing the wafer seriatim into a plurality of processing stations while maintaining the desired position attained in step (h).

3. A method as set forth in claim 2 including the step of:
   (i) maintaining a vacuum in the aligner station and in each of the processing stations.

4. A method as set forth in claim 2 wherein step (h) includes the step of post positioning the wafer with a reference to a new desired position, including the steps of:
   (j) generally positioning the reference in a position within the sensing range of the sensor of step (b); and
   (k) rotating the wafer until the reference of the wafer has been aligned with a second reference in the aligner station.

5. A method as set forth in claim 4 including the step of:
   (l) computing an eccentricity vector $\epsilon$ having a magnitude representative of the spatial dislocation of the centroid O relative to the point P and having an orientation $\phi$ representative of the angle subtended by a first line connecting the point P and the centroid O relative to a second line connecting opposite corners of the wafer;
   (m) providing a robot arm for lifting the wafer from its step (j) position in the aligner station and advancing the wafer seriatim into a plurality of processing stations while maintaining the desired position attained in step (h).

6. A method as set forth in claim 1
wherein step (c) includes the step of:
   (g) forming on the peripheral edge of the wafer at a discrete location an artifact which alters the regular contour of the peripheral edge.

7. A method as set forth in claim 1
wherein the wafer is opaque;
wherein the sensor of step (b) is a light sensor; and
wherein step (b) includes the step of:
   (g) directing a broad beam of light toward the light sensor in a direction transverse of a plane of the wafer and coextensive with the peripheral edge of the wafer such that only light not obstructed by the wafer reaches and is detected by the light sensor.

8. A method as set forth in claim 1
wherein the wafer is transparent;
wherein the sensor of step (b) is a light sensor; and
wherein step (c) includes the step of:
   (g) forming on the peripheral edge of the transparent wafer a continuous artifact which alters the light transmissibility of the transparent wafer; and
wherein step (b) includes the step of:

(h) directing a broad beam of light toward the light sensor in a direction transverse of a plane of the transparent wafer and coextensive with the peripheral edge of the wafer such that an optical effect resulting from the continuous artifact is detected by the light sensor.

9. A method as set forth in claim 1 wherein all of the following steps and relationships occur as observing a plan view of the wafer; and wherein step (f) includes the steps of:
(g) defining the corners of the wafer as A, B, C, and D as one advances in a clockwise direction along the peripheral edge thereof about the centroid O;
(h) defining the X-axis in an XOY coordinate system as a line connecting corners A and C and passing through the centroid O;
(i) projecting point P onto the X-axis at a point F to thereby define a line $\overline{OF}$;
(j) scribing a Y-axis through the centroid O perpendicular to the X-axis;
(k) projecting point P onto the Y-axis at a point E' to thereby define a line $\overline{OE'}$;

$$\sqrt{\overline{OF}^2 + \overline{OE'}^2}\ ;$$

(m) determining the orientation $\phi$ as $\tan^{-}(\overline{OE'}/\overline{OF})$.

10. A method as set forth in claim 9 wherein the curve generated in step (e) includes four discrete linear aligned sections and four discrete parabolic sections extending transverse of the linear aligned sections, the four discrete parabolic sections being spaced apart and generally being mutually parallel, each of the four discrete parabolic sections having a nose at a location of maximum perpendicular distance from the linear aligned sections; and including the steps of:
(n) positioning the curve defining the peripheral edge in an XY coordinate system such that the four discrete linear aligned sections are generally parallel to the X-axis; and
(o) measuring the maximum perpendicular distance on the wafer between the point S and each respective corner of the wafer being, respectively, the lines $\overline{SA}$, $\overline{SB}$, $\overline{SC}$, and $\overline{SD}$.

11. A method as set forth in claim 1 wherein all of the following steps and relationships occur as observing a plan view of the wafer; and wherein step (f) includes the steps of:
(g) defining the corners of the wafer as A, B, C, and D as one advances in a clockwise direction along the peripheral edge thereof about the centroid O;
(h) defining the X-axis in an XOY coordinate system as a line connecting corners A and C and passing through the centroid O;
(i) projecting point P onto the X-axis at a point F to thereby define a line $\overline{OF}$;
(j) projecting point P onto the line $\overline{BD}$ at a point E to thereby define a line $\overline{OE}$;

$$\sqrt{\overline{OF}^2 + \overline{OE'}^2}\ ;$$

(l) determining the orientation $\phi$ as $\tan^{-1}(\overline{OE'}/\overline{OF})$.

wherein the length of line $\overline{OF}$ is approximately equal to the length of line $\overline{PA}$ minus the length of line $\overline{PC}$; and wherein the length of line $\overline{OE}$ is approximately equal to the length of line $\overline{PD}$ minus the length of line $\overline{PB}$.

12. A method as set forth in claim 11 wherein the curve generated in step (e) includes four discrete linear aligned sections and four discrete parabolic sections extending transverse of the linear aligned sections, the four discrete parabolic sections being spaced apart and generally being mutually parallel, each of the four discrete parabolic sections having a nose at a location of maximum perpendicular distance from the linear aligned sections; and including the steps of:
(n) positioning the curve defining the peripheral edge in an XY coordinate system such that the four discrete linear aligned sections are generally parallel to the X-axis; and
(o) measuring the maximum perpendicular distance on the wafer between the point S and each respective corner of the wafer being, respectively, the lines $\overline{SA}$, $\overline{SB}$, $\overline{SC}$, and $\overline{SD}$.

13. A method as set forth in claim 1 wherein the curve generated in step (e) includes four discrete linear aligned sections and four discrete parabolic sections extending transverse of the linear aligned sections, the four discrete parabolic sections being spaced apart and generally being mutually parallel, each of the four discrete parabolic sections having a nose at a location of maximum perpendicular distance from the linear aligned sections; and wherein one of the corners of the wafer has a fiducial; and including the step of:
(n) determining the specific corner which has the fiducial.

14. A method as set forth in claim 13 including the steps of:

(o) positioning the curve defining the peripheral edge in an XY coordinate system such that the four discrete linear aligned sections are generally parallel to the X-axis; and (p) in the region of the nose for each of the four discrete parabolic sections, computing the rate of change of direction of the curve in the direction of the ordinate with increased distance along the abscissa; and (q) comparing the rates of change obtained in step (p); and (r) from step (q), determining the curve which has the least rate of change and, is therefore, the corner which has the fiducial.

15. A method of repositioning a right quadrilateral semiconductor wafer having a centroid O and a continuous peripheral edge with four sides and four peripherally spaced corners from a first location to a second location comprising the steps of:

(a) supporting the wafer for rotation about an axis of rotation which intersects the wafer at a point P and for translation along an X-axis and a Z-axis;

(b) providing an edge sensor for detecting the profile of the peripheral edge;

(c) establishing an initial point of reference on the peripheral edge for detection by the sensor;

(d) rotating the wafer about the axis of rotation;

(e) during step (d), sensing the profile of the peripheral edge and generating a curve defining the profile of the peripheral edge including at least part of the four sides and the four peripherally spaced corners based on values relative to the initial point of reference;

(f) computing an eccentricity vector $\phi$ from the sensed positions of the corners of the wafer having a magnitude representative of the spatial dislocation of the centroid O relative to the point P and having an orientation $\phi$ representative of the angle subtended by a line connecting the point P and the centroid O relative to the X-axis; and (g) applying control signals derived from the eccentricity vector $\epsilon$ to reposition the wafer to the second location.

* * * * *

UNITED STATES PATENT AND TRADEMARK OFFICE
CERTIFICATE OF CORRECTION

PATENT NO. : 6,195,619 B1  Page 1 of 1
DATED : February 27, 2001
INVENTOR(S) : Jie Ren It is certified that error appears in the above-identified patent and that said Letters Patent is hereby corrected as shown below:

Column 10,
Line 22, delete "(i)" and replace with -- (j) --.

Column 11,
Line 25, delete "$\sqrt{\overline{OF^2}+\overline{OE'^2}}$" and replace with -- (1) determining the magnitude of $\varepsilon$ as $\sqrt{\overline{OF^2}+\overline{OE'^2}}$ ; and --;

Line 62, delete "$\sqrt{\overline{OF^2}+\overline{OE'^2}}$" and replace with -- (k) determining the magnitude of $\varepsilon$ as $\sqrt{\overline{OF^2}+\overline{OE'^2}}$ ; and --.

Signed and Sealed this

Twentieth Day of November, 2001

Attest:

NICHOLAS P. GODICI
*Attesting Officer*  *Acting Director of the United States Patent and Trademark Office*